US007145372B2

(12) United States Patent
Tang et al.

(10) Patent No.: US 7,145,372 B2
(45) Date of Patent: Dec. 5, 2006

(54) STARTUP CIRCUIT AND METHOD

(75) Inventors: Qiang Tang, Stanford, CA (US); Ramin Ghodsi, Cupertino, CA (US); Douglas Bardsley, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 10/930,976

(22) Filed: Aug. 31, 2004

(65) Prior Publication Data

US 2006/0044053 A1 Mar. 2, 2006

(51) Int. Cl.
*H03L 7/00* (2006.01)

(52) U.S. Cl. .................................. 327/143; 327/198

(58) Field of Classification Search ............... 327/143, 327/198, 539–543
See application file for complete search history.

(56) References Cited

U.S. PATENT DOCUMENTS 4,912,435 A 3/1990 Williams et al.
5,155,384 A * 10/1992 Ruetz .......................... 327/537
5,565,811 A * 10/1996 Park et al. .................. 327/198
6,084,388 A * 7/2000 Toosky ........................ 323/313
6,084,454 A * 7/2000 Holst .......................... 327/198
6,191,644 B1 2/2001 Srinath et al.
6,392,470 B1 5/2002 Burstein et al.
6,404,252 B1 * 6/2002 Wilsch ........................ 327/198
6,412,977 B1 * 7/2002 Black et al. ................ 374/178
6,509,726 B1 1/2003 Roh
6,600,361 B1 * 7/2003 Nagaya et al. .............. 327/538
6,677,808 B1 * 1/2004 Sean et al. .................. 327/539
6,784,652 B1 8/2004 Aude
6,807,105 B1 10/2004 Ogura et al.
6,815,941 B1 11/2004 Butler
6,933,769 B1 * 8/2005 Koelling ..................... 327/538

* cited by examiner

*Primary Examiner*—Kenneth B. Wells
(74) *Attorney, Agent, or Firm*—Leffert Jay & Polglaze P.A.

(57) ABSTRACT

A startup circuit provides a single connection to a node of a reference or other circuit to be started. The startup circuit injects high current into devices to start a reference circuit. The startup circuit provides strong current invention during startup, and low power consumption during operation.

21 Claims, 7 Drawing Sheets

STARTUP CIRCUIT AND METHOD

FIELD

The present invention relates generally to startup circuits and in particular the present invention relates to low power startup circuits.

BACKGROUND

Reference voltages are needed in equipment such as power supplies, current supplies, panel meters, calibration standards, data conversion systems, and the like. Bandgap reference circuits are typically chosen to produce reference voltages due to their ability to maintain stable output voltages that vary little with temperature and supply voltage.

A typical bandgap reference circuit 10 is shown in FIG. 1. Circuit 10 includes an amplifier 11 and a bandgap voltage generator 12. The output of the bandgap reference circuit (at node Vbgr) stabilizes according to the following equation:

$$\begin{aligned} Vbgr &= Vbe2 + (Vbe1 - Vbe2) * (1 + 2 * R1/R2) \quad (1) \\ &= Vbe2 + (Vt * \ln(n)) * (1 + 2 * R1/R2) \end{aligned}$$

where Vbe1 and Vbe2 are the base to emitter voltages of bipolar junction transistors (BJTs) 15 and 16, respectively, and R1 and R2 are the resistances of the resistors 13 and 14 respectively. Vt is the thermal voltage, which is approximately 25.853 milliVolts (mV) at a temperature of 300 degrees Kelvin (~26.84 decrees Celsius), and n is the ratio of the current density of BJTs 15 and 16.

In equation (1), the first term on the right hand side has a negative temperature coefficient, while the second term on the right had side has a positive temperature coefficient. An almost zero temperature coefficient can be obtained by setting a proper ratio between the first and the second terms on the right had side of the equation.

An intrinsic problem with a bandgap reference circuit such as circuit 10 is that it has two stable states. A first stable state is the normal operational state, where Vbgr is equal to about 1.25 Volts (V). The second stable state is the zero-current state, where Vbgr is equal to 0 and Vbias is equal to 0.

To prevent the reference circuit 10 from staying in the zero-current state, a startup circuit, such as startup circuit 23 shown in FIG. 2, is normally added to the bandgap reference circuit. The startup circuit may include a resistor and several diode-connected n-channel metal oxide semiconductor field effect transistors (NMOSFETs). In circuit 23, the voltage at terminal 24 is higher than Vt1+Vt2, where Vt1 and Vt2 are the threshold voltages of transistors 18 and 19, respectively. This ensures that Vbias, Vbgr, and the voltage at node 25 will be pulled to at least Vt1+Vt2−Vt3, where Vt3 is the threshold voltage of the transistors 20, 21, and 22. Therefore, using the startup circuit 23, the bandgap circuit will be powered up to the normal operational state.

The startup circuit 23 has two major drawbacks. First, if the power supply voltage Vcc is less than Vt1+Vt2, then Vbias, Vbgr, and the voltage at node 25 can only be pulled up to a level of Vcc−Vt3. For example, if Vcc=1.6 V, and Vt3=1.0 V, Vbias, Vbgr, and the node 25 voltage can be pulled to 0.6 V, which is not enough to turn on the NMOSFETs 26, 27, 28, and 29, and BJTs 15 and 16 provided the threshold voltages of those devices are larger than 0.6 V, since typical threshold voltages for such devices are approximately 0.7 V. Therefore, the bandgap reference circuit 10 will stay in the zero-current state. Second, the startup circuit 23 consumes power during the normal operation of the circuit 10. This is unacceptable, especially if the circuit 10 is used for portable devices, which have stringent power consumption requirements of a few microwatts.

For the reasons stated above, and for other reasons stated below which will become apparent to those skilled in the art upon reading and understanding the present specification, there is a need in the art for a startup circuit for low power circuits.

SUMMARY

The above-mentioned problems with startup circuits and other problems are addressed by the present invention and will be understood by reading and studying the following specification.

In one embodiment, a startup circuit includes a first branch including a current injection path to inject a strong current on initialization, and a second branch including a current leakage reduction path to limit current leakage after startup of the circuit.

In another embodiment, a circuit includes a reference circuit branch having a node to be started, and a startup circuit branch for the node to be started. The startup circuit branch is electrically connected to the node, and includes a first branch including a current injection path to inject a strong current on initialization, and a second branch including a current leakage reduction path to limit current leakage after startup of the circuit.

In yet another embodiment, a method of operating a startup circuit includes injecting a strong current into a node to be started during initialization of the startup circuit, and limiting leakage current from the startup circuit during normal operation.

In another embodiment, a method of injecting large injection current during initialization of a circuit to be started includes connecting a p-channel transistor and first and second n-channel transistors source to drain in series between a supply voltage and ground, and injecting current upon initialization through the p-channel transistor and the first n-channel transistor to a node to be started.

In yet another embodiment, a method of limiting leakage current during normal operation of a circuit started with a startup circuit includes using a body effect of at least one p-channel transistor to reduce leakage current from the startup circuit.

In still another embodiment, a memory device includes an array of memory cells, control circuitry to read, write and erase the memory cells, address circuitry to latch address signals provided on address input connections, and a startup circuit connected to start at least one node of the control circuitry or the address circuitry. The startup circuit for each node includes a first branch and a second branch, the first branch including a current injection path to inject a strong current to the node on initialization, and the second branch including a current leakage reduction path to limit current leakage after startup of the circuit.

In another embodiment, a processing system includes a processor and a memory coupled to the processor to store data provided by the processor and to provide data to the processor. The memory includes an array of memory cells, control circuitry to read, write and erase the memory cells, address circuitry to latch address signals provided on address input connections, and a startup circuit connected to start at least one node of the control circuitry or the address circuitry, the startup circuit comprising, for each of the at least one node:

a first branch and a second branch, the first branch comprising a current injection path to inject a strong current to the node on initialization, and the second branch comprising a current leakage reduction path to limit current leakage after startup of the circuit.

Other embodiments are described and claimed.

DETAILED DESCRIPTION

Figure 1:
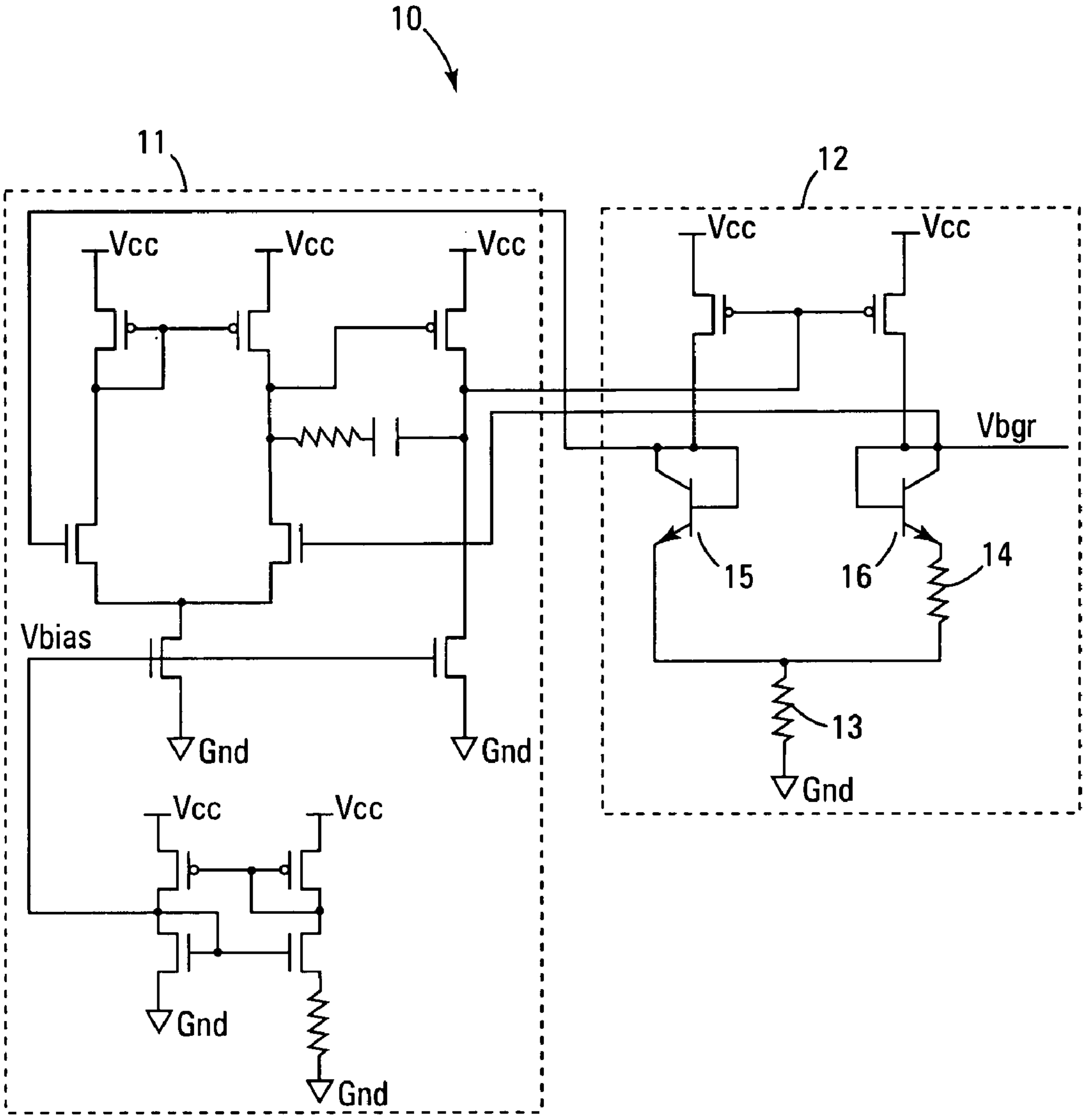
Fig. 1 Prior Art
FIG. 1 is a circuit diagram of a prior art bandgap reference circuit.
Figure 2:
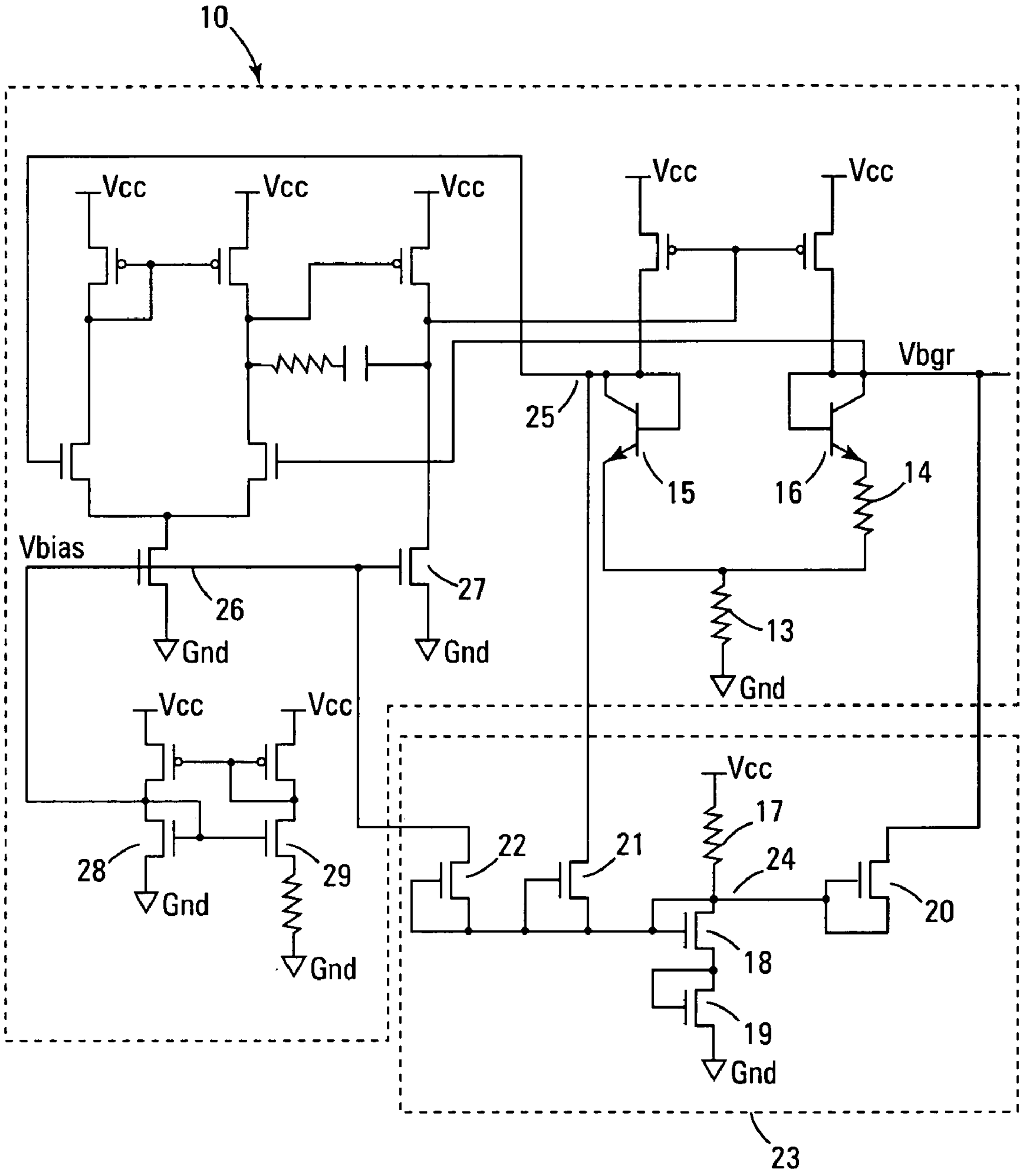
Fig. 2 Prior Art
FIG. 2 is a circuit diagram of a prior art startup circuit connected to a bandgap reference circuit.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

Figure 3:
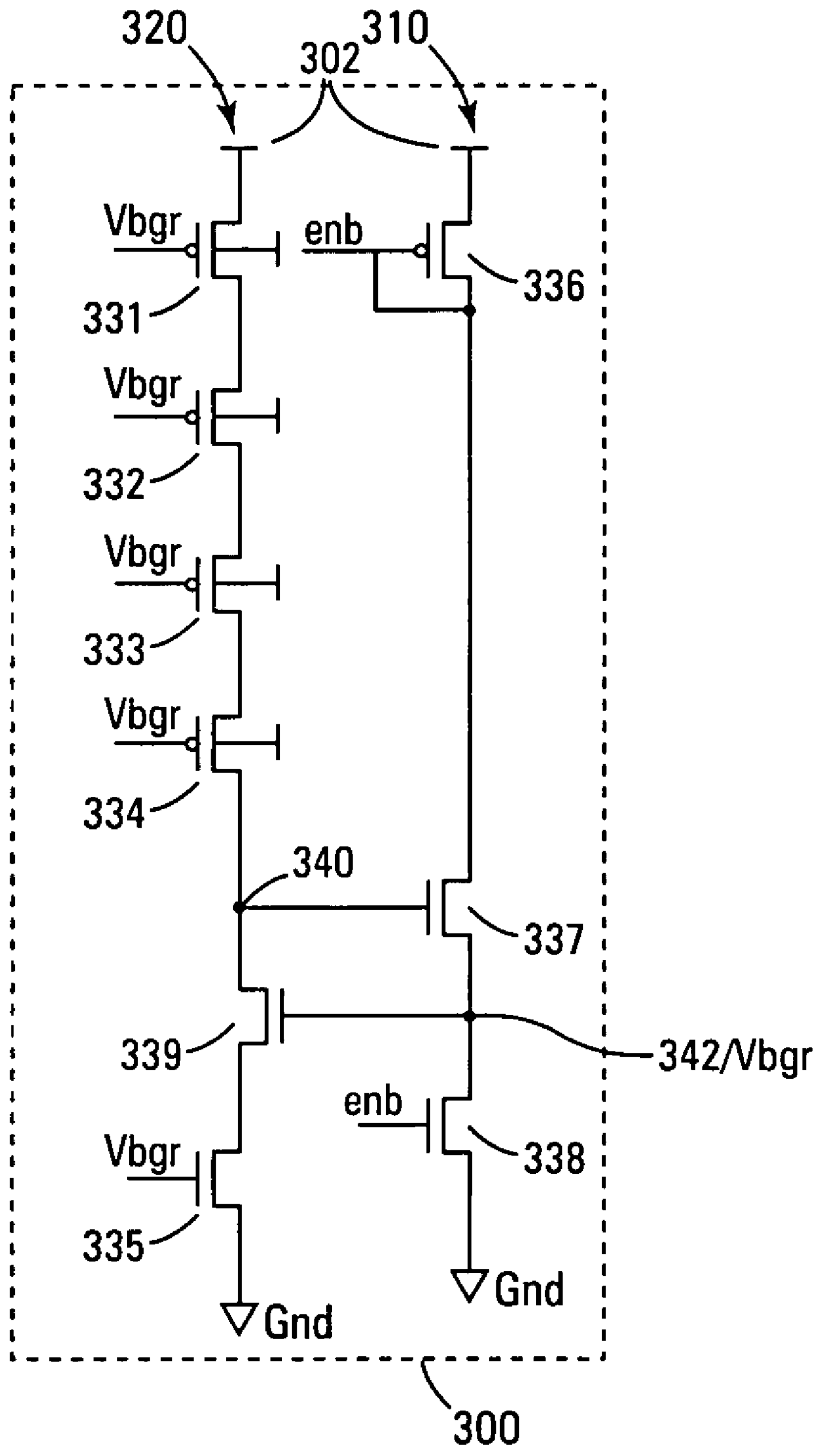
FIG. 3 is a circuit diagram of a startup circuit according to one embodiment of the present invention.
Figure 4:
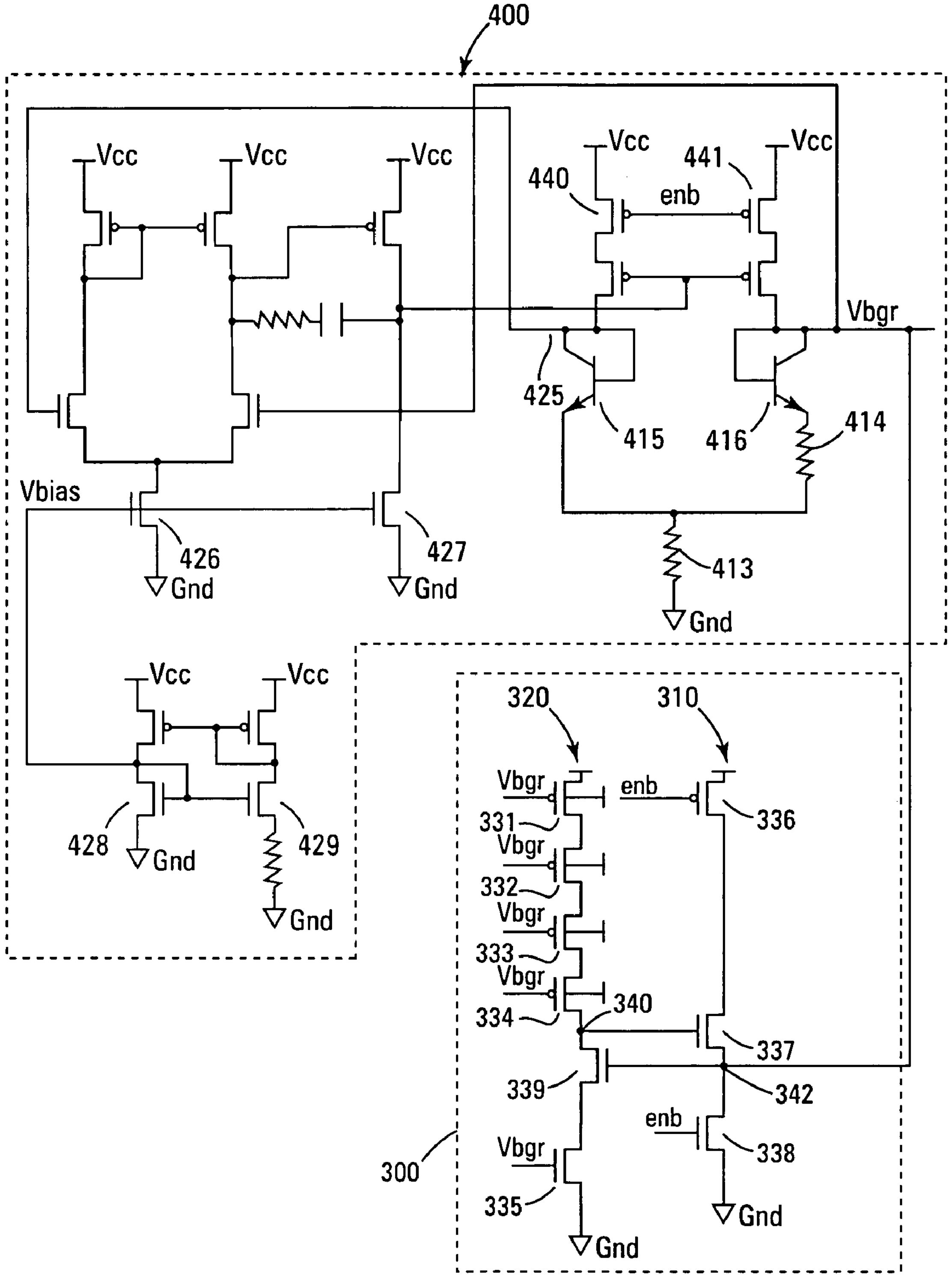
FIG. 4 is a circuit diagram of a startup circuit according to one embodiment of the present invention connected to a reference circuit.

An improved startup circuit 300 is shown in FIGS. 3 and 4. FIG. 3 is a circuit diagram of a startup circuit 300 according to one embodiment of the present invention. Circuit 300 comprises two circuit branches 310 and 320, each connected between a supply voltage 302 and ground. Branch 310 includes a PMOS transistor 336, and NMOS transistors 337 and 338, all source to drain connected in series between the supply voltage 302 and ground. Transistors 336 and 338 are each gate connected to an enable signal enb. Branch 320 includes four PMOS transistors 331, 332, 333, and 334, and two NMOS transistors 339 and 335, all source to drain connected in series between the supply voltage and ground. The PMOS transistors 331, 332, 333, 334, and 335 are each gate connectable to a node (indicated in FIG. 3 as Vbgr) of a circuit that is to be started using the circuit 300. The gate of transistor 337 is connected to a node 340 between transistor 334 and transistor 339, and the gate of transistor 339 is connected to a node 342 (also node Vbgr, see also FIG. 4) between transistor 337 and transistor 338.

Circuit 300 is shown connected to a bandgap reference circuit 400 in FIG. 4. Node 342/Vbgr of circuit 300 is connected to the node of the circuit to be started, in this embodiment node Vbgr of bandgap reference circuit 100, to start node Vbgr. Circuit 400 is similar to circuit 10 of FIG. 1 in one embodiment. Two PMOS transistors 440 and 441 are connected to the enable signal enb in the circuit 400.

Before the reference circuit 400 is started, the enable signal providing a potential to node enb and to transistors 336 and 338 of circuit 300 is at Vcc. With this voltage at node enb, transistors 336, 440, and 441 are off. NMOSFET 338 is on, pinning node Vbgr to ground. NMOSFETs 335 and 339 are off, and PMOSFETs 331, 332, 333, and 334 are fully on. Node 340 is therefore pulled to Vcc. NMOSFET 337 is on, but no current flows into node Vbgr because PMOSFET 336 is off. BJT 416 is also off. This greatly reduces if not eliminates leakage current through branch 310 of the circuit 300.

When the reference circuit 400 is enabled, node enb goes to ground. Initially, node Vbgr remains close to ground. PMOSFETs 331, 332, 333, 334, 440, and 441 turn on, NMOSFET 337 is on, and NMOSFETs 335 and 338 are off. At the beginning of the cycle, PMOSFET 336 and NMOSFET 337 are fully on (their absolute gate to source voltages are approximately Vcc). Therefore at the beginning of the cycle, a large current injects into node Vbgr through FETs 336 and 337. The ideal current value can be represented as:

$$\mu*Cox*W/L*(|Vgs|-|Vt|)^2/2$$

of FET 336 if it is weaker than FET 337, or $$\mu*Cox*W/L*(|Vgs|-|Vt|)^2/2$$

of FET 337 if it is weaker than FET 336.

Figure 5:
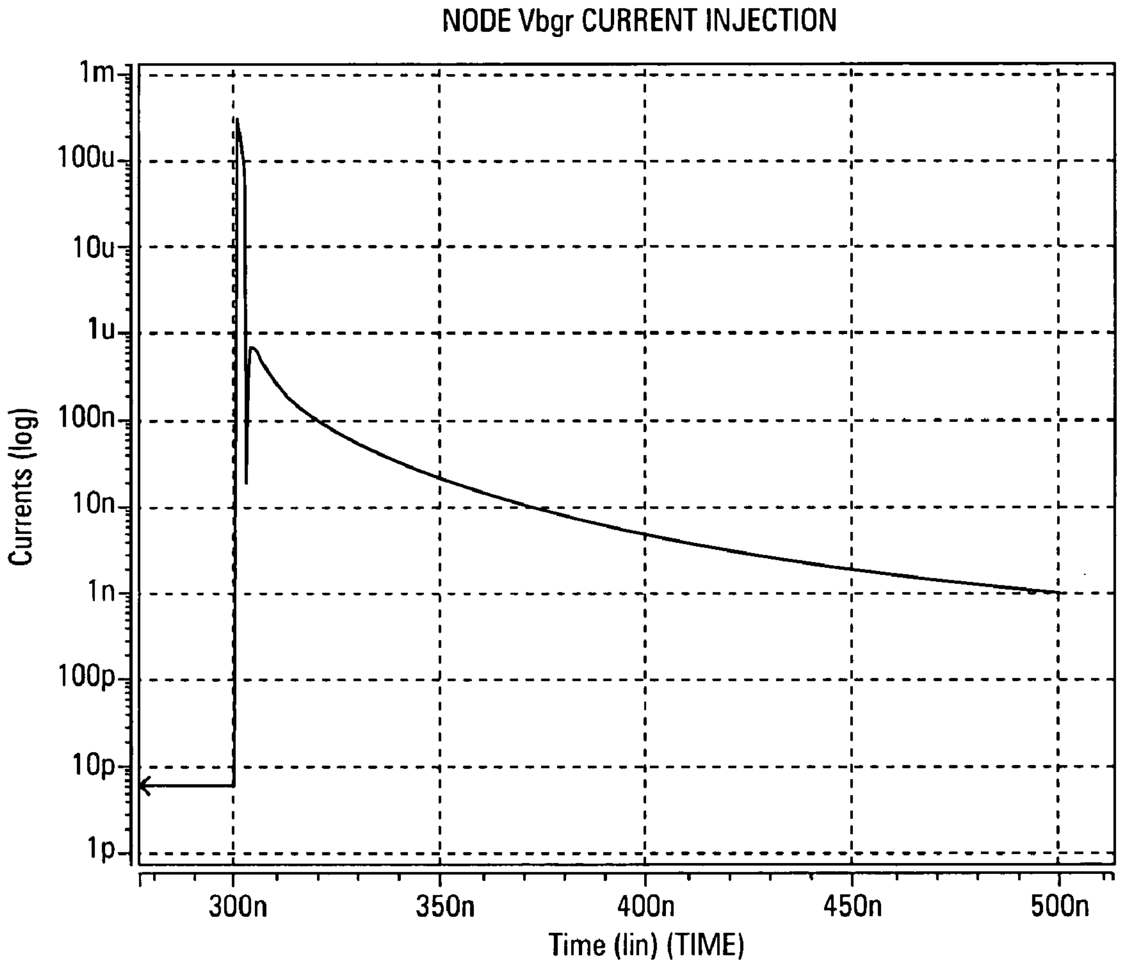
FIG. 5 is a plot of Vbgr current injection over time for one embodiment of the present invention.

The current injection into node Vbgr after the circuit has been enabled at the time of approximately 300 nanoseconds is shown in FIG. 5. The current injection brings node Vbgr to a higher voltage. When the voltage at node Vbgr becomes greater than about 0.7 V at room temperature, BJT 416 turns on.

Figure 6:
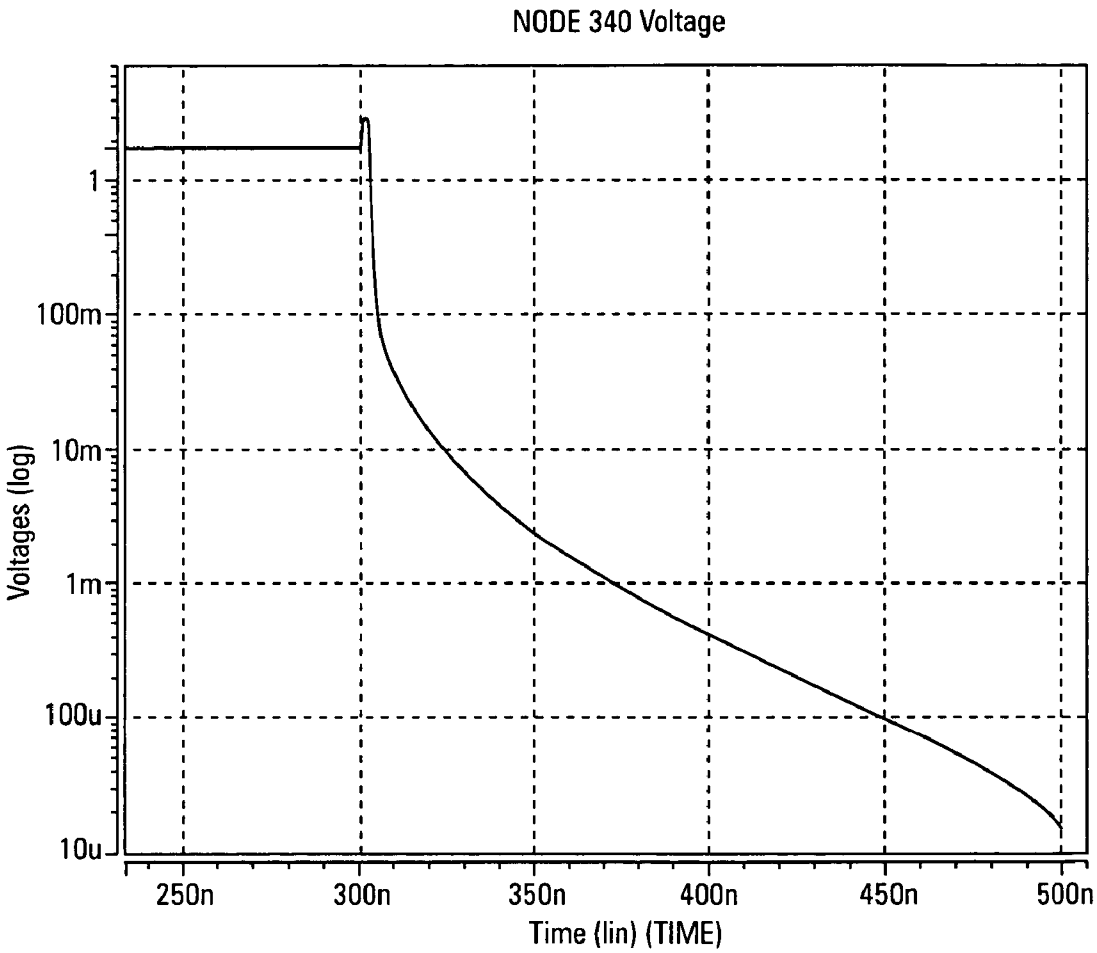
FIG. 6 is a plot of Vbgr node voltage over time for one embodiment of the present invention.

After the bandgap reference circuit stabilizes to the operational state, node Vbgr rises to approximately 1.25 V. At this potential, NMOSFETs 335 and 339 are on. PMOSFET 331 switches from fully on at the beginning of the startup sequence to weakly on (its absolute gate to source voltage equals Vcc−Vbgr). The drain to source voltage drop across the weakly on FET 331 causes the source voltage of FET 332 to drop below Vcc. The body effect, caused by the source voltage of FET 332 being lower than the Nwell voltage (Vcc) gives transistor 332 a higher threshold voltage Vt than transistor 331. Therefore, PMOS 332 is on, but is on even more weakly than PMOS 331, presuming they have the same size, because |Vgs−Vt| of PMOS 332 is smaller than PMOS 331. Similar analysis applies to PMOSs 333 and 334. The result is that the voltage at node 340 is pushed very close to ground. The node voltage at node 340 after the circuit has been enabled for approximately 300 ns is shown in FIG. 6. PMOS 334 and NMOS 337 are actually off at this time. The current consumption of the two branches 310 and 320 of the startup circuit 300 after startup is zero if leakage current is not taken into account. After startup, the voltage at node Vbgr can remain at any voltage between Vtn and Vcc (approximately 1.8 V) and not be disturbed by the startup circuit, where Vtn is the threshold voltage of devices 335 and 339.

In another embodiment, two more startup circuits like startup circuit 300 are used to start up nodes 425 and Vbias of circuit 400. Such circuits are connected similarly to the way circuit 300 is connected to node Vbgr of circuit 400, and operate in the same fashion. Nodes 425 and Vbias in that embodiment each have their own startup circuit, with the respective nodes fed back in the same way as circuit 300 has node Vbgr fed back to it to start up node Vbgr. Each can use a separate startup circuit with its own enable signal, and feeds nodes back the same way node Vbgr is fed back to the circuit 300. In this way, multiple nodes of a circuit can be started, with the same benefits of the startup circuit. Further, the nodes can be started in an order that is most logical for power consumption and the like for the circuit being started.

Other types of circuits for which the embodiments of the present invention are useful include by way of example but not by way of limitation, any circuit using a large amount of current injection which then shuts off itself after stabilization of the Vbgr node. The startup circuit embodiments of the present invention may be used with many different startup circuits, not just bandgap circuits, but anything that is to be started. Further, many low power analog circuits also need and use startup circuits. The embodiments of the present invention are also amenable to use with such analog circuits as well.

Figure 7:
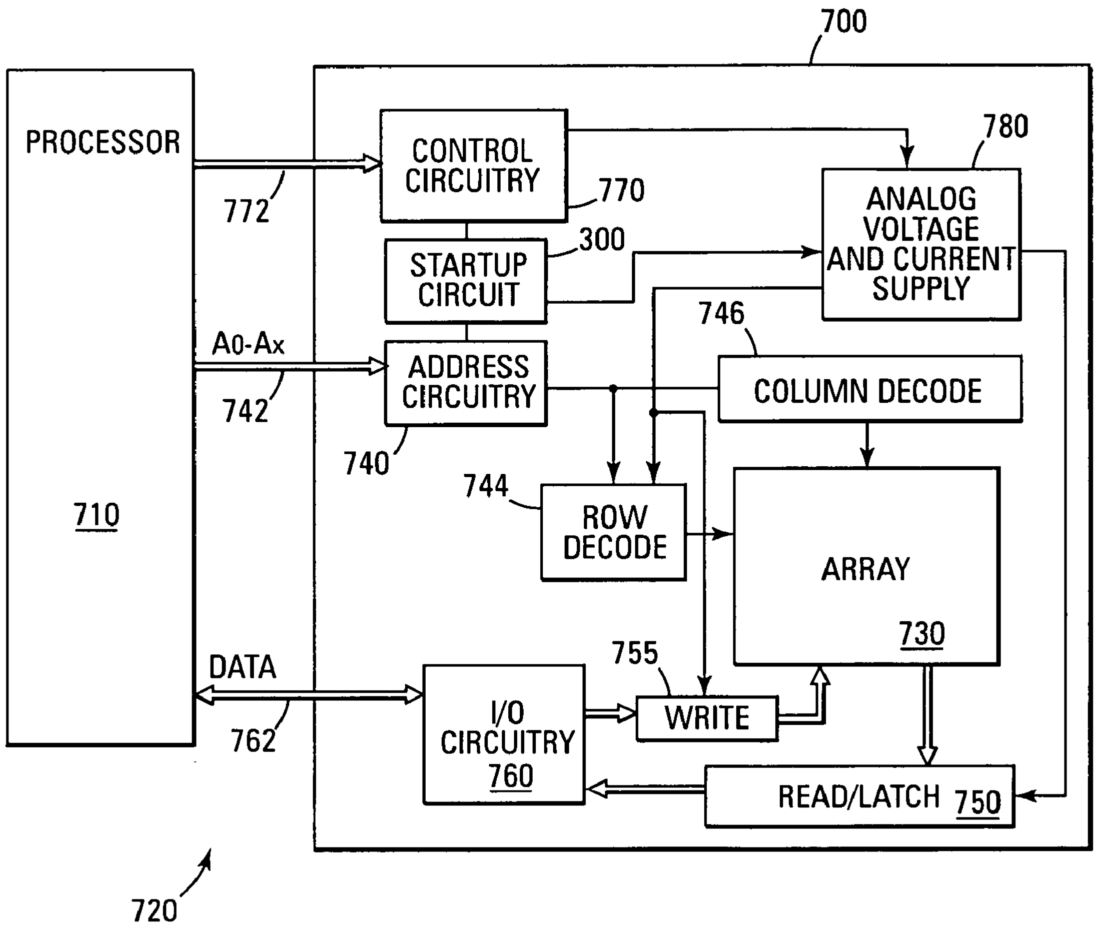
FIG. 7 is a block diagram of a memory and processing system on which embodiments of the present invention are practiced.

FIG. 7 is a functional block diagram of a memory device 700, such as a flash memory device, of one embodiment of the present invention, which is coupled to a processor 710. The memory device 700 and the processor 710 may form part of an electronic system 720. The memory device 700 has been simplified to focus on features of the memory that are helpful in understanding the present invention. The memory device includes an array of memory cells 730. The memory array 730 is arranged in banks of rows and columns.

An address buffer circuit 740 is provided to latch address signals provided on address input connections A0-Ax 742. Address signals are received and decoded by row decoder 744 and a column decoder 746 to access the memory array 730. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 730 by sensing voltage or current changes in the memory array columns using sense/latch circuitry 750. The sense/latch circuitry, in one embodiment, is coupled to read and latch a row of data from the memory array. Data input and output buffer circuitry 760 is included for bi-directional data communication over a plurality of data (DQ) connections 762 with the processor 710, and is connected to write circuitry 755 and read/latch circuitry 750 for performing read and write operations on the memory 700.

Command control circuit 770 decodes signals provided on control connections 772 from the processor 710. These signals are used to control the operations on the memory array 730, including data read, data write, and erase operations. An analog voltage and current supply 780 is connected to control circuitry 770, row decoder 744, write circuitry 755, and read/latch circuitry 750. In a flash memory device, analog voltage and current supply 780 is important due to the high internal voltages necessary to operate a flash memory. The flash memory device has been simplified to facilitate a basic understanding of the features of the memory. A more detailed understanding of internal circuitry and functions of flash memories are known to those skilled in the art.

A startup circuit, such as startup circuit 300, is shown in FIG. 7 connected to control circuitry 770, address circuitry 740, and analog voltage and current supply 780. The startup circuit 300 is used in various embodiments in a memory device and in a processing system including processor 710, to startup various nodes of the circuitry within the memory device or the system. It should be understood that any circuit or node in such a memory device or processing system that needs to be started may be started with the embodiments of the present invention, and that while not all connections are shown, such connections and use of the startup circuit embodiments of the present invention are within its scope. It should also be understood that while a generic memory device is shown, the startup circuit embodiments of the present invention are amenable to use with multiple different types of memory devices, including but not limited to dynamic random access memory (DRAM), synchronous DRAM, flash memory, and the like.

The embodiments of the present invention offer good startup behavior to a reference circuit while keeping almost zero current consumption after startup. The concept is in part based on the MOSFET body effect, so it is reliable and easy to implement, and has a small size.

CONCLUSION

A startup circuit has been described that is able to inject high current into npn bipolar junction transistors, pnp BJTs, or the gates of MOSFET current sources in to start a reference circuit with a Vcc of 1.4–2.2 V. The invention utilizes the body effect of MOSFETs to eliminate the leakage through the startup circuit after the bandgap circuit successfully starts, while still offering strong current injection during startup of the bandgap circuit.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed:

1. A startup circuit, comprising:

a first branch and a second branch, the first branch comprising a current injection path to inject a current into a startup node on initialization, and the second branch comprising a current leakage reduction path to limit current leakage in the startup circuit after startup of the circuit, wherein the first branch further comprises:

a p-channel transistor and first and second n-channel transistors source to drain connected in series between a supply voltage and ground, the p-channel transistor and the second n-channel transistor gate controlled by an external enable circuit, the gate of the first n-channel transistor connected to the second branch of the startup circuit, and the p-channel transistor and the first n-channel transistor providing an injection current on initialization of the startup circuit.

2. A startup circuit, comprising:

a first branch and a second branch, the first branch comprising a current injection path to inject a current into a startup node on initialization, and the second branch comprising a current leakage reduction path to limit current leakage in the startup circuit after startup of the circuit, wherein the second branch further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the first branch.

3. The startup circuit of claim 1, wherein the second branch further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the gate of the first transistor of the first branch.

4. A circuit, comprising:

a reference circuit branch having a node to be started; and a startup circuit branch for the node, the startup circuit branch electrically connected to the node, and comprising:

a first branch and a second branch, the first branch comprising a current injection path to inject a current into a startup node on initialization, and the second branch comprising a current leakage reduction path to limit current leakage in the startup circuit after startup of the circuit, wherein the first branch of the startup circuit further comprises:

a p-channel transistor and first and second n-channel transistors source to drain connected in series between a supply voltage and ground, the p-channel transistor and the second n-channel transistor gate controlled by an external enable circuit, the gate of the first n-channel transistor connected to the second branch of the startup circuit, and the p-channel transistor and the first n-channel transistor providing an injection current on initialization of the startup circuit.

5. The circuit of claim 4, wherein the second branch of the startup circuit further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the gate of the first transistor of the first branch.

6. The circuit of claim 4, wherein the reference circuit is a bandgap reference circuit.

7. The circuit of claim 4, wherein the reference circuit is an analog circuit.

8. A circuit, comprising:

a reference circuit branch having a node to be started; and a startup circuit branch for the node, the startup circuit branch electrically connected to the node, and comprising:

a first branch and a second branch, the first branch comprising a current injection path to inject a current into a startup node on initialization, and the second branch comprising a current leakage reduction path to limit current leakage in the startup circuit after startup of the circuit, wherein the second branch of the startup circuit further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the first branch.

9. A circuit, comprising:

a reference circuit branch having a plurality of nodes to be started; and a startup circuit branch for each of the plurality of nodes, each startup circuit branch electrically connected to its respective node, and comprising:

a first branch and a second branch, the first branch comprising a current injection path to inject a current into a startup node on initialization, and the second branch comprising a current leakage reduction path to limit current leakage in the startup circuit after startup of the circuit, wherein the first branch of each startup circuit further comprises:

a p-channel transistor and first and second n-channel transistors source to drain connected in series between a supply voltage and ground, the p-channel transistor and the second n-channel transistor gate controlled by an external enable circuit, the gate of the first n-channel transistor connected to the second branch of the startup circuit, and the p-channel transistor and the first n-channel transistor providing an injection current on initialization of the startup circuit.

10. The circuit of claim 9, wherein the reference circuit is a bandgap reference circuit.

11. The circuit of claim 9, wherein the reference circuit is an analog circuit.

12. A circuit, comprising:

a reference circuit branch having a plurality of nodes to be started; and a startup circuit branch for each of the plurality of nodes, each startup circuit branch electrically connected to its respective node, and comprising:

a first branch and a second branch, the first branch comprising a current injection path to inject a current into a startup node on initialization, and the second branch comprising a current leakage reduction path to limit current leakage in the startup circuit after startup of the circuit, wherein the second branch of each startup circuit further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the first branch.

13. The circuit of claim 9, wherein the second branch of each startup circuit further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the gate of the first transistor of the first branch.

14. A method of operating a startup circuit, comprising:

injecting a current into a node to be started during initialization of the startup circuit; and limiting leakage current from the startup circuit during normal operation, wherein injecting comprises:

connecting a p-channel transistor and first and second n-channel transistors source to drain in series between a supply voltage and ground, and injecting current upon initialization through the p-channel transistor and the first n-channel transistor to the node to be started.

15. A method of operating a startup circuit, comprising:

injecting a current into a node to be started during initialization of the startup circuit; and limiting leakage current from the startup circuit during normal operation, wherein limiting leakage current comprises:

connecting first, second, third, and fourth p-channel transistors and first and second n-channel transistors source to drain in series between a supply voltage and ground, the first, and using a body effect of the second, third, and fourth transistors to reduce the leakage current.

16. A method of operating a startup circuit, comprising:

injecting a current into a node to be started during initialization of the startup circuit; and limiting leakage current from the startup circuit during normal operation, wherein:

injecting comprises:

connecting a p-channel transistor and first and second n-channel transistors of a first startup circuit branch source to drain in series between a supply voltage and ground, and injecting current upon initialization through the p-channel transistor and the first n-channel transistor of the first startup circuit branch to a node between the first n-channel transistor and the second n-channel transistor of the first startup circuit branch; and wherein:

limiting leakage current comprises:

connecting the first, second, third, and fourth p-channel transistors and first and second n-channel transistors of a second startup circuit branch source to drain in series between a supply voltage and ground;

connecting the gates of the first, second, third, and fourth p-channel transistors and the first and second n-channel transistors of the second startup circuit branch to the node to be started;

connecting a node between the fourth p-channel transistor and the first n-channel transistor of the second startup circuit branch to the gate of the first transistor of the first startup circuit branch; and using a body effect of the second, third, and fourth p-channel transistors of the second startup circuit branch to reduce the leakage current.

17. A method of limiting leakage current during operation of a circuit started with a startup circuit, the method comprising:

using a body effect of at least one p-channel transistor to reduce leakage current from the startup circuit, wherein limiting leakage current further comprises:

connecting first, second, third, and fourth p-channel transistors and first and second n-channel transistors source to drain in series between a supply voltage and ground, the first, and using a body effect of the second, third, and fourth transistors to reduce the leakage current.

18. A memory device comprising:

an array of memory cells; and control circuitry to read, write and erase the memory cells;

address circuitry to latch address signals provided on address input connections; and a startup circuit connected to start at least one node of the control circuitry or the address circuitry, the startup circuit comprising, for each of the at least one node:

a first branch and a second branch, the first branch comprising a current injection path to inject a current to the node on initialization, and the second branch comprising a current leakage reduction path to limit current leakage in the startup circuit after startup of the circuit;

wherein the first branch further comprises:

a p-channel transistor and first and second n-channel transistors source to drain connected in series between a supply voltage and ground, the p-channel transistor and the second n-channel transistor gate controlled by an external enable circuit, the gate of the first n-channel transistor connected to the second branch of the startup circuit, and the p-channel transistor and the first n-channel transistor providing an injection current on initialization of the startup circuit.

19. The memory device of claim 18, wherein the second branch further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the first branch.

20. A processing system, comprising:

a processor; and a memory coupled to the processor to store data provided by the processor and to provide data to the processor, the memory comprising:

an array of memory cells; and control circuitry to read, write and erase the memory cells;

address circuitry to latch address signals provided on address input connections; and a startup circuit connected to start at least one node of the control circuitry or the address circuitry, the startup circuit comprising, for each of the at least one node:

a first branch and a second branch, the first branch comprising a current injection path to inject a current to the node on initialization, and the second branch comprising a current leakage reduction path to limit current leakage in the startup circuit after startup of the circuit;

wherein the first branch further comprises:

a p-channel transistor and first and second n-channel transistors source to drain connected in series between a supply voltage and ground, the p-channel transistor and the second n-channel transistor gate controlled by an external enable circuit, the gate of the first n-channel transistor connected to the second branch of the startup circuit, and the p-channel transistor and the first n-channel transistor providing an injection current on initialization of the startup circuit.

21. The processing system of claim 20, wherein the second branch further comprises:

first, second, third, and fourth p-channel transistors and first and second n-channel transistors source to drain connected in series between a supply voltage and ground, the first, second, third, and fourth p-channel transistors and the first and second n-channel transistors each gate connected to the node to be started, and a node between the fourth p-channel transistor and the first n-channel transistor connected to the first branch.

* * * * *